United States Patent
Shona et al.

(10) Patent No.: US 6,314,155 B1
(45) Date of Patent: Nov. 6, 2001

(54) COUNTING CIRCUIT WITH REWRITABLE NON-VOLATILE MEMORY, AND COUNTING METHOD

(75) Inventors: Yoshihiro Shona; Seiichi Yamazaki; Keiichi Itoh, all of Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/166,846

(22) Filed: Oct. 6, 1998

(30) Foreign Application Priority Data

Oct. 7, 1997 (JP) .................................................. 9-274228

(51) Int. Cl.⁷ ..................................................... G06M 3/00
(52) U.S. Cl. ................................................. 377/26; 377/16
(58) Field of Search ............................................ 377/26, 16

(56) References Cited

U.S. PATENT DOCUMENTS 4,109,283 * 8/1978 Rast ......................................... 358/191
4,456,876 * 6/1984 Haymaker ............................... 377/52
4,853,526   8/1989 Effing .

FOREIGN PATENT DOCUMENTS 0 266 267   10/1987 (EP) .
0 662 691   12/1993 (EP) .
7-141478     6/1995 (JP) .

\* cited by examiner

Primary Examiner—Margaret R. Wambach
(74) Attorney, Agent, or Firm—Rabin & Berdo, P.C.

(57) ABSTRACT

A frequency counter 1 includes a binary counter section 11 having a binary counter 20 for counting up frequency data, and a EEPROM counter section 12 having an EEPROM 40 containing frequency data. In a frequency count processing, frequency data of the EEPROM 40 are loaded into the binary counter 20. The binary counter 20 executes count up by a specified frequency on the loaded frequency data. The counted up frequency data are written into the EEPROM 40 to update the frequency data of the EEPROM 40. In one frequency count process, rewriting of the EEPROM 40 is completed once, which means that the number of time the EEPROM 40 is rewritten is reduced.

20 Claims, 11 Drawing Sheets

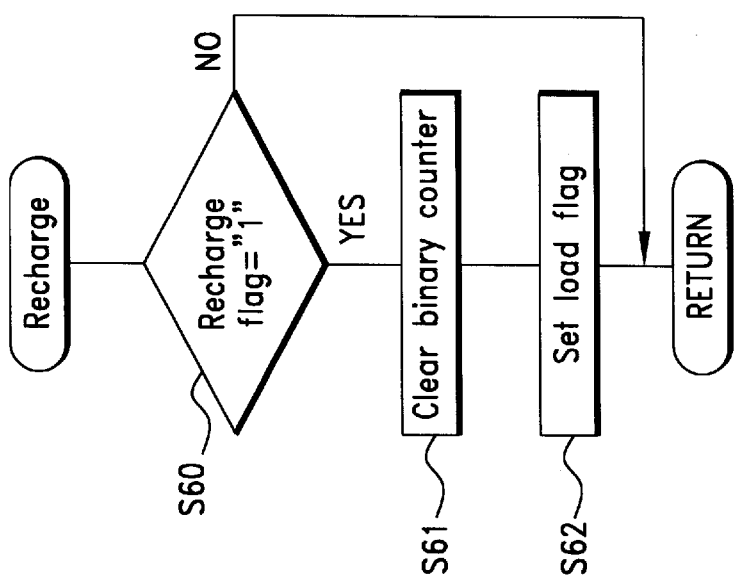
FIG. 12
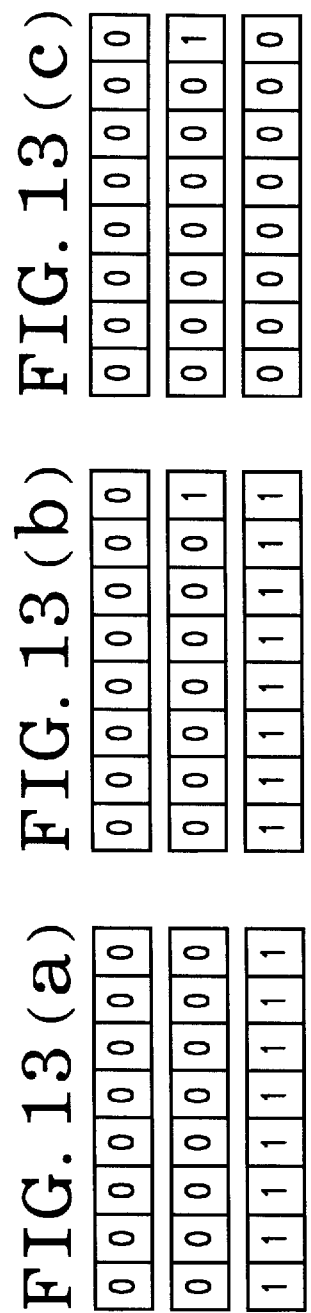

COUNTING CIRCUIT WITH REWRITABLE NON-VOLATILE MEMORY, AND COUNTING METHOD

BACKGROUND OF THE INVENTION

1. Field of the Invention

The present invention relates to a frequency counter, provided with a non-volatile memory such as EEPROM, used in an IC card such as a pre-paid card, and to a frequency counting method using this frequency counter, and particularly to a frequency counter suitable for use where the maximum count frequency is large, or one large frequency is counted at a time, such as in a prepaid shopping card, and to a counting method.

2. Description of the Related Art

Japanese Patent laid-open No. Hei. 7-141478, for example, discloses a conventional frequency counter and counting method for use with an IC card. FIG. 13 is a drawing explaining a frequency counter and frequency counting process of the related art. As shown in FIG. 13(a), the frequency counter and counting process of the related art has an 8-bit fill-in type counter, comprising an electrically rewritable non-volatile memory, such as EEPROM, with multiple stages, and one bit is written in for each frequency count. If one stage has 8 bits filled in, then the next stage will have one bit filled in, as shown in FIG. 13(b). After that, as shown in FIG. 3(c), the fill-in type counter at the stage that is all filled in is cleared to '0'.

The number of guaranteed rewrite operations of an EEPROM is restricted to approximately 10,000. For this reason, the above described frequency counter and frequency counting method of the related art can not be applied to use where the maximum frequency is as large as 100,000, such as in a prepaid shopping card. Also, a frequency counter constructed using EEPROM with a large maximum frequency would be very large. Still further, the above-described method of the related art counts one at a time, which means that when frequency counts from a few hundred to tens of thousands are counted in one go, as in a prepaid shopping card, processing takes a long time.

The present invention is intended to solve the above-mentioned problems of the related art, and an object of the present invention is to reduce the number of times a non-volatile memory is rewritten. A further object is to reduce the number of memory cells of a non-volatile memory for the maximum frequency. A still further object of the present invention is to shorten the count processing time.

SUMMARY OF THE INVENTION

In order to achieve the above-mentioned objects, a count circuit of the present invention has a rewritable non-volatile memory, and comprises a non-volatile memory for storing first data composed of a plurality of bits, and a counter for generating second data obtained by updating an arbitrary bit of first data read out from the non-volatile memory to a fixed value, and outputting the second data to the non-volatile memory.

A counting method of the present invention uses a rewritable non-volatile memory, and includes a first step of reading out first data composed of a plurality of bits stored in the non-volatile memory, a second step of generating second data by updating an arbitrary bit of first data read out from the non-volatile memory to a fixed value by counting, and a third step of writing the second data to the non-volatile memory.

BRIEF DESCRIPTION OF THE DRAWINGS

FIG. 12 is a flowchart showing a recharge process for the frequency counter of the second embodiment of the present invention.

FIG. 13 is a diagram illustrating a count process in a frequency counter of the related art.

DETAILED DESCRIPTION OF THE PREFERRED EMBODIMENTS

First Embodiment

Figure 1:
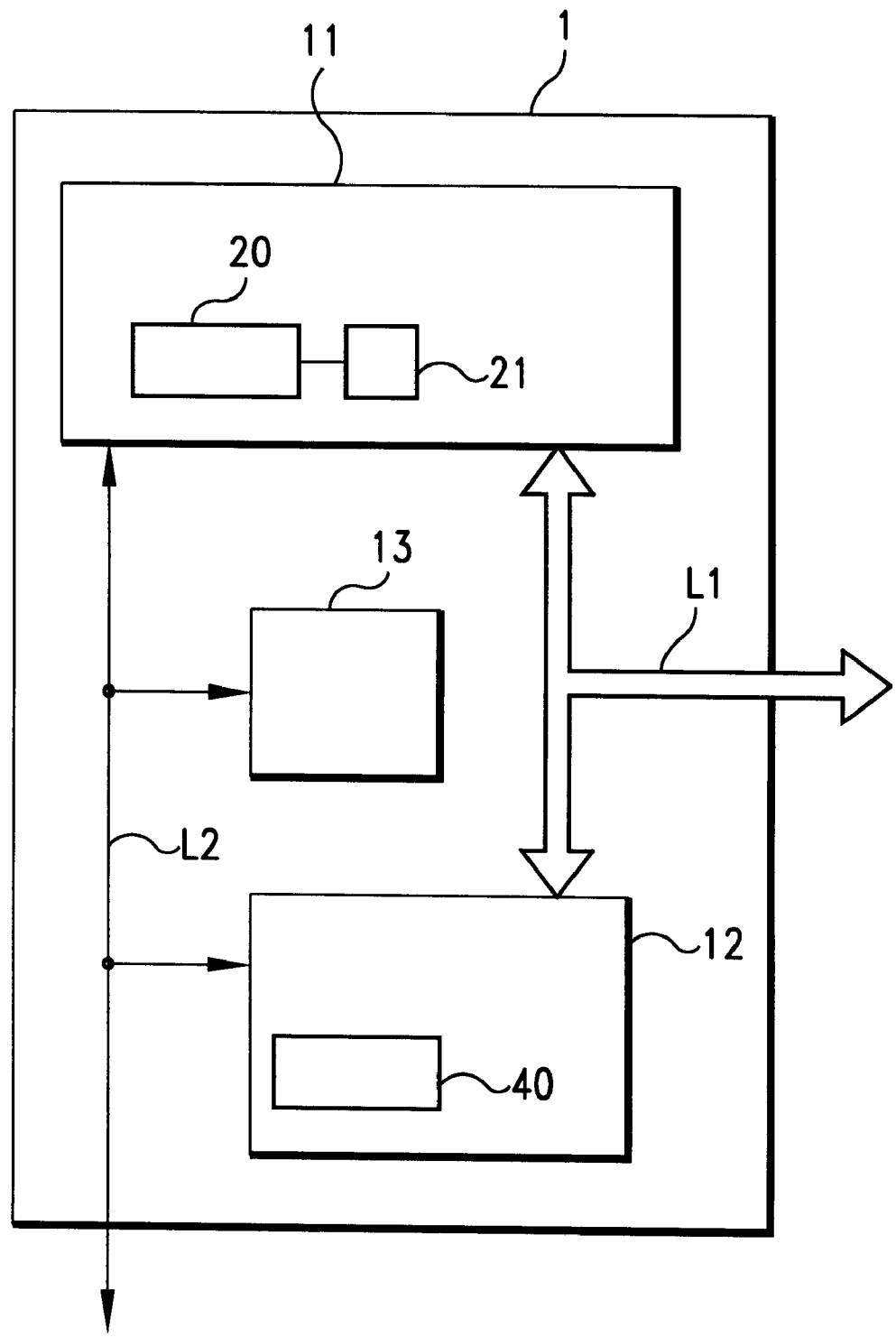
FIG. 1 is a block diagram showing a frequency counter of a first embodiment of the present invention.

FIG. 1 is a block schematic diagram of a frequency counter 1 of a first embodiment of the present invention. The frequency counter 1 comprises a binary counter section 11, an EEPROM counter section 12, a load flag 13 for indicating a load state of data from the EEPROM counter section 12, a data bus L1 and a control line section L2. The binary counter section 11 has a binary counter 20 and a carry flag section 21. The EEPROM counter section 12 has an EEPROM 40 for storing frequency data.

The data bus L1 comprises bus lines for 8 bits, b0, b1 ... b7, and is connected to the binary counter section 11 and the EEPROM counter section 12. The control line section L2 has control lines for controlling the binary counter section 11, the EEPROM counter section 12 and the load flag 13, and output signal lines from the load flag 13 and the carry flag section 21. The control lines of the control line section L2 for controlling the binary counter section 11 are made up of control lines for transmitting count up pulses UP0, UP1 ... UP7, load count signals LD1, LD0, LD2, store count signals RD0, RD1, RD2, and a clear signal CLR.

Figure 2:
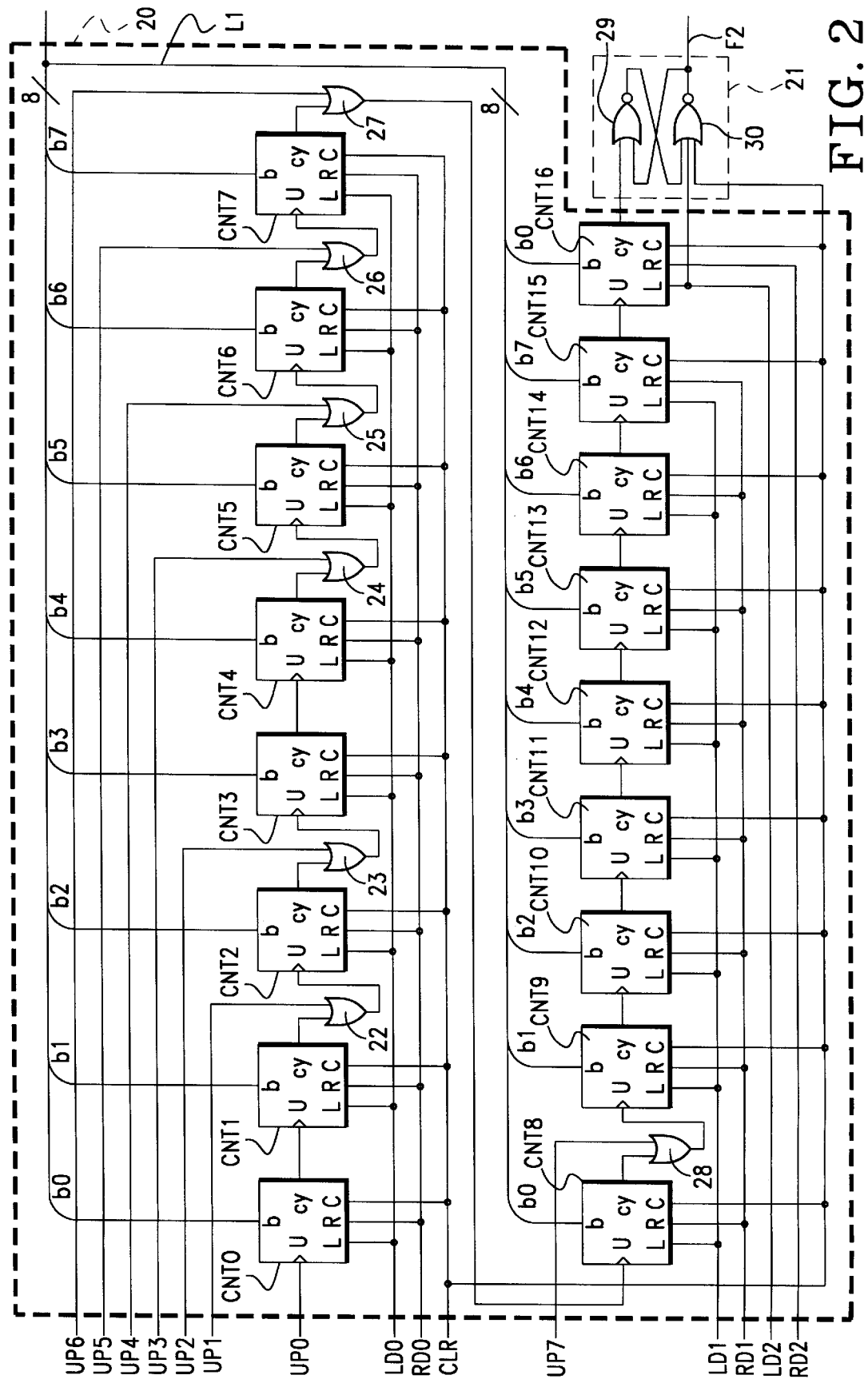
FIG. 2 is a circuit diagram of a binary counter section of the frequency counter of the first embodiment.

FIG. 2 is an example circuit diagram of the binary counter section 11. In FIG. 2, the binary counter section 11 comprises a binary counter 20, a carry flag section 21, a connection terminal for connecting to each of the bus lines b0–b7 of the 8 bits of data bus L1, an input terminal for each of the count up pulses UP0, UP1 ... UP7, load count signals LD0, LD1, LD2, store count signals RD0, RD1, RD2, and a clear signal CLR, and a carry flag output terminal F2.

The binary counter 20 comprises bit counters CNT0, CNT1, CNTn (n is a positive integer) for executing (n+1) bit counting, and OR gates (22, 23 ... 28 in FIG. 2). In FIG. 2, the maximum frequency is assumed to be a frequency count of 100,000. For this reason, the counter executes (n+1=17) bit counting.

The bit counters CNT0–CNT16 have the same internal structure. Bit counter CNTi (i is an arbitrary integer between 0 and n) is comprised of a count up pulse input terminal U, a load count signal LD (one of LD0–LD2) input terminal L, a store count signal RD (one of RD0–RD2) input terminal R, a clear signal CLR input terminal C, a data input/output terminal b, and a carry output terminal cy.

The b terminals of the bit counters CNT0, CNT8 and CNT16 are connected to bus line b0 of the data bus L1. The b terminals of the counters CNT1 and CNT9 are connected to bus connection terminal b1. The b terminals of counters CNT2 and CNT10 are connected to bus line b2. The b terminals of counters CNT3 and CNT11 are connected to bus line b3. The b terminals of counters CNT4 and CNT12 are connected ito bus line b4. The b terminals of counters CNT5 and CNT13 are connected to bus line b5. The b terminals of counters CNT6 and CNT14 are connected to bus line b6. The b terminals of counters CNT7 and CNT15 are connected to bus line b7. Signal LD0 is input to the L terminal of CNT0–CNT7, signal LD1 is input to the L terminal of CNT8–CNT15, and the signal LD2 is input to the L terminal of CNT16. Signal RD0 is input to the R terminal of CNT0–CNT7, signal RD1 is input to the R terminal of CNT8–CNT15, and the signal RD2 is input to the R terminal of CNT16.

The bit counters CNT0–CNT16 are connected in a cascade arrangement, with the cy terminal of a counter CNTj (where j is an arbitrary integer between 0 and n−1) connected to the U terminal of the next bit counter CNT(j+1), either directly or through one of OR gates 22–28. Counters CNT0 and CNT1, CNT3 and CNT4, and CNT9–CNT16 are directly connected. Counters CNT1 and CNT2, CNT2 and CNT3, and CNT4–CNT9 are connected through respective OR gates 22–28. Count up pulses UP (UP1 to UP6) are input to OR gates provided between some of the successive counters. Thus, count up pulse UP1 is connected to the U terminal of counter CNT2 through OR gate 22. Count up pulse UP2 is connected to the U terminal of counter CNT3 through OR gate 23. Count up pulse UP3 is connected to the U terminal of counter CNT5 through OR gate 24. Count up pulse UP4 is connected to the U terminal of counter CNT6 through OR gate 25. Count up pulse UP5 is connected to the U terminal of counter CNT7 through OR gate 26. Count up pulse UP6 is connected to the U terminal of counter CNT8 through OR gate 27. Count up pulse UP7 is connected to the U terminal of counter CNT9 through OR gate 28.

The count up pulses UP (UP1 to UP7) are pulses for carrying out a count up for respective count step values of $2^0$, $2^2$, $2^3$, $2^5$, $2^6$, $2^7$, $2^8$, and $2^9$. The load count signals LD0–LD2 are signals for loading frequency data stored in the EEPROM counter section 12 (refer to FIG. 1) into the binary counter 20 through the data bus L1. The store count signals RD0–RD2 are signals for storing frequency count data of the binary counter 20 in the EEPROM counter section 12 through the data bus L1. The clear signal CLR is a signal for clearing the binary counter 20.

The carry flag section 21 is a circuit for indicating the overflow condition of the binary counter 20. The carry flag section 21 has NOR gates 29 and 30, and a carry flag output F2 representing whether or not the binary counter 20 has overflowed is generated at the output terminal of the NOR gate 30. A first input terminal of the NOR gate 29 is connected to the cy terminal of bit counter CNT16 of the most significant bit of the binary counter 20. A second input terminal of the NOR gate 29 is connected to the output terminal of NOR gate 30. A first input terminal of NOR gate 30 is connected to the output terminal of NOR gate 29. The signal LD2 is input to a second input terminal of NOR gate 30. The clear signal CLR is input to the third input terminal of the NOR gate 30. If the load count signal LD2 or the clear signal CLR is at an H level, the carry flag section 21 clears the carry flag output F2 to a logic level "0" (L level) indicating that there is no overflow. If the cy terminal of the counter CNT16 is "H", the carry flag section 21 sets the carry flag output F2 to a logic level "1" (H level), indicating that there is an overflow.

Figure 3:
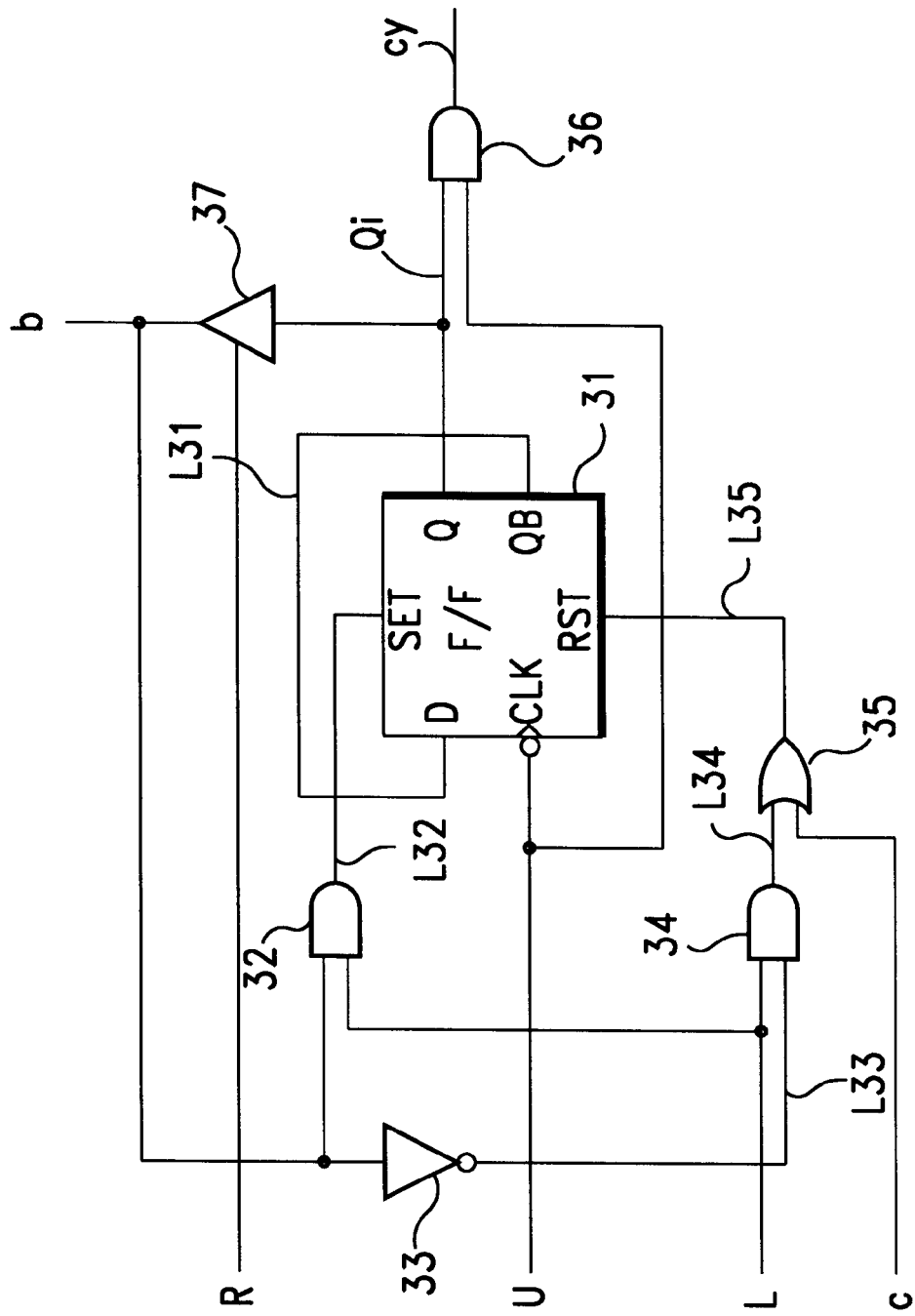
FIG. 3 is a circuit diagram of a bit counter of the binary counter section in FIG. 2.

FIG. 3 is a circuit diagram of a bit counter CNT1 of the binary counter 20. The bit counter CNT1 comprises a D-type flip-flop (D–F/F) 31, AND gates 32, 34 and 36, an inverter 33, an OR gate 35, and a tri-state gate 37. Also, as was described for FIG. 2, the counter CNT1 has a terminal b, a terminal U, a terminal L, a terminal R, a terminal C and a terminal cy.

The D–F/F 31 is a falling edge triggered D–F/F, and has an input terminal D to which an internal signal L31 is input, a set terminal SET to which an internal signal L32 is input, a reset terminal RST to which an internal signal L35 is input, a clock input terminal connected to the U terminal (input terminal for count up pulse UP), a data output terminal Q for generating a count bit Qi, and an inverted data output terminal QB for generating the internal signal L31.

The AND gate 32 has a first input terminal connected to data input/output terminal b, a second input terminal connected to terminal L (load count signal LD input terminal), and an output terminal generating internal signal L32. The inverter 33 has an input terminal connected to data input/output terminal b and an output terminal generating internal signal L33 which is the inverse of the signal at terminal b. The AND gate 34 has a first input terminal to which internal signal L33 is supplied (that is, connected to the data input/output terminal b through the inverter 33), a second input terminal connected to terminal L, and an output terminal generating internal signal L34. The OR gate 35 has a first input terminal to which internal signal L34 is supplied, a second input terminal connected to terminal C (clear signal CLR input terminal), and an output terminal generating internal signal L35.

The AND gate 36 has a first input terminal to which the count bit Qi is supplied, a second input terminal connected to the U terminal, and an output terminal for generating a carry signal cy and connected to the terminal cy. The tri-state gate 37 has an input terminal to which the count bit Qi is supplied, an output terminal connected to the data input/output terminal b, and a control terminal connected to terminal R (store count signal RD input terminal). The tri-state gate 37 generates the count bit Qi at the input terminal on its own output terminal and supplies it to the data input/output terminal b when the control terminal is at an H level (when the signal input from the R terminal is an H level). When the control terminal is at an L level (when the signal input from the R terminal is an L level), the tri-state gate causes a high impedance state between the input terminal and the output terminal.

Figure 4:
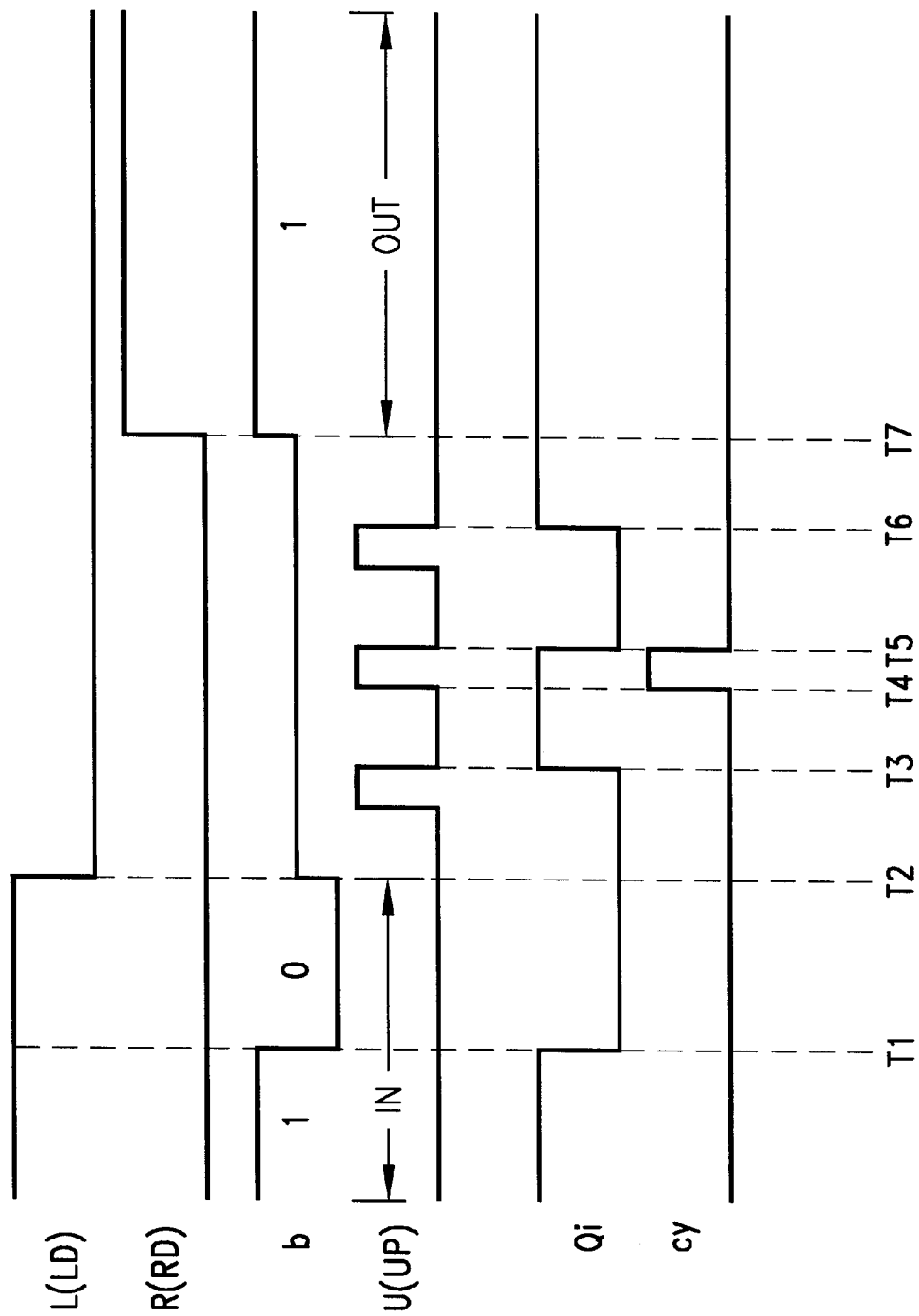
FIG. 4 is a timing diagram showing the operation of the bit counter in FIG. 3.

Next, the operation of the bit counter CNTi will be described. FIG. 4 is a timing diagram for use in describing the operation of the bit counter CNTi. In FIG. 4, waveforms are shown for each of the L terminal (load count signal LD), the U terminal (count up pulse UP), the T terminal (store count signal RD), the count bit Qi and the carry signal cy. The processing for the frequency counter 1 (refer to FIG. 1) is roughly divided into a load count process, where frequency data stored in the EEPROM 40 of the EEPROM counter section 12 (refer to FIG. 1) is loaded into the binary counter 20, a count up process in which loaded frequency data is counted up by only a frequency to be added, and a store count process in which frequency data that has been counted up is written into the EEPROM 40 as new frequency data. In FIG. 4, the time up to time T2 where the L terminal goes to an H level corresponds to the load count process, the time from T2–T7 corresponds to the count up process, and the time from T7 where terminal R goes to an H level corresponds to the store count process.

At first, terminal U and terminal R are at an L level, and when terminal b has been set to an H level via the data bus L1 (refer to FIG. 1), if the terminal L is caused to change from an L level to an H level by the load count signal LD, all of the input terminals of the AND gate 32 become H level, causing the SET terminal of the D–F/F 31 (internal signal L32) to go to an H level. Accordingly, the Q terminal of the D–F/F 31 is set to an H level and the count bit Qi is an H level. Next, with the L terminal remaining at the H level, if the b terminal is caused to change to an L level by the data bus L1, the internal signal L33 goes to an H level and all the input terminals of the AND gate 34 are made H level, making the RST terminal of the D–F/F 31 (internal signal L35) an H level (at this time, the SET terminal is at an L level). Accordingly, the Q terminal of the D–F/F 31 is set to an L level and the count bit Qi becomes an L level.

Specifically, the bit counter CNTi sets the data supplied to terminal b in the D–F/F 31 if the terminal L is at an H level. A frequency data bit stored in the EEPROM 40 is thus supplied to the terminal b through the data bus L1, and if the terminal L is made H level it can be loaded into the bit counter CNTi corresponding to that frequency data bit. If the binary counter is constructed using (n+1) bit counters CNT0–CNTn, as in the binary counter 20 of FIG. 2, frequency data of (n+1) bits can be loaded into this binary counter by the terminal L going to an H level.

Next, with the U terminal and the R terminal remaining at L level, if the L terminal is caused to be changed from an H level to an L level, and the above-mentioned bit data is prevented from being supplied to terminal b (T2), there is a high impedance state between the input and output terminals of the tri-state gate 37, which means that the terminal b is in a floating state, but the count bit Q1 is held at an L level by the D–F/F 31. Count up pulses UP are then supplied to terminal U, and on the falling edge of the first pulse (T3) the Q terminal of the D–F/F 31 changes from an L level to an H level, and the count bit Qi becomes an H level. For the duration of this first pulse, the cy signal remains at an L level. Next, on the rising edge of the second UP pulse (T4) all the input terminals of the AND gate 36 become H level, so the carry signal cy changes from an L level to an H level. On the falling edge of the second UP pulse (T5), the count bit Qi is inverted to an L level, and the carry signal cy is also inverted to an L level. On the falling edge of the third UP pulse (T6), the count bit Qi is set to an H level again.

Specifically, the bit counter CNTi alternately inverts the count bit Qi between an H level and an L level for every falling edge of the count pulses input from the U terminal, and when the count bit Qi changes from terminal an H level to an L level a carry pulse is output from cy. Accordingly, if the (n+1) bit counters CNT0–CNTn are cascade connected, as in the binary counter in FIG. 2, it is possible to make a (n+1) bit binary counter that counts up 1 (=$2^0$) for every falling edge of count up pulses UP input to the bit counter CNT0 of the first stage. Also, an OR gate is provided between the cascade connections of the cy terminal of bit counter CNTj and the U terminal of bit counter CNT(j+1), as in FIG. 2, and a count up pulse UP (a signal independent of signal UP0 input to the initial stage bit counter CNT0) can be input to the U terminal of bit counter CNT(j+1) through the OR gate. In this way, the binary counter 20 is capable of counting up by a value of $2^{j+1}$ for every falling edge of count up pulses UP. Accordingly, a binary counter having the above-described construction is capable of counting up in count up steps of $2^i$ by applying count up pulses to the U terminal of bit counter CNTi through an OR gate connected thereto. It is not necessary to provide an OR gate at every cascade connection section, and they can be provided, for example, at cascade connection sections corresponding to count step values that are used often. In the binary counter 20 of FIG. 2, OR gates are provide in the cascade connection sections of CNT1–CNT3, and CNT4–CNT9. As a result, the binary counter 20 counts up by, for example, 4 using count up pulse UP1, and counts up by $2^8$ using count up pulse UP6 input to the bit counter CNT8.

Next, with terminal L and terminal U remaining at an L level, if terminal R is caused to change from an L level to an H level by the store count signal RD (T7), the count bit Qi that has been respectively inverted at T3, T5 and T6 and has been set to H level, is output to the b terminal by the tri-state gate 37.

Specifically, if the R terminal goes to an H level the bit counter CNT1 outputs the count bit Qi to terminal b. Accordingly, the count bit that has been counted up is supplied to the EEPROM 40 through the data bit L1, and can be written into the EEPROM 40 (EEPROM frequency data can be updated).

Returning to FIG. 1, the EEPROM 40 of the EEPROM counter section 12 has, for example memory cells s0, s1 . . . s16 (not shown) for 17 bits. Memory cell s0 is a memory cell for being written with the least significant bit of frequency data, namely count bit Q0, while memory cell s16 is a memory cell for being written with the most significant bit of frequency data, namely count bit Q16. Memory cells s0–s16 are divided into 3 bytes, and rewriting of data is carried out in byte units. Memory cells s0–s7 are the lower byte, memory cells s8–s15 are the middle byte, and memory cell s16 is the upper byte. Here, after rewriting of data for the upper byte including the most significant bit, data of the middle and lower bytes are rewritten. Rewriting of data for each byte is carried out by erasing data for all memory cells within the byte, then writing data to specified cells within the byte. Also, the data erased state corresponds to a frequency data bit value of 1, with the data rewritten state corresponding to a value of 0. When the data of all memory cells s0–s16 is in the rewritten state, this corresponds to an initial frequency data value (=0), while when the data of all memory cells s0–s16 is in the erased state it corresponds to a maximum frequency data value.

The structure of the load flag 13 is preferably a combination of 2 NOR gates, similar to the structure of the carry flag section 21 shown in FIG. 2, for example. The output of the load flag 13 is made the load flag output F1. Here, when the load flag output F1 is a logic level "1", it indicates that load count processing has been carried out, and when the load flag output F1 is at a logic level "0" it indicates that load count processing has not yet been carried out.

Figure 5:
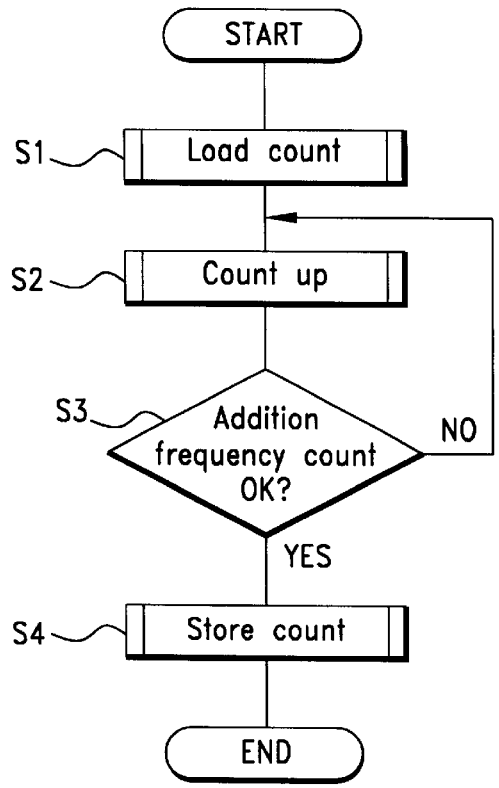
FIG. 5 is a flowchart showing the frequency counting process of the frequency counter of the first embodiment of the present invention.
Figure 6:
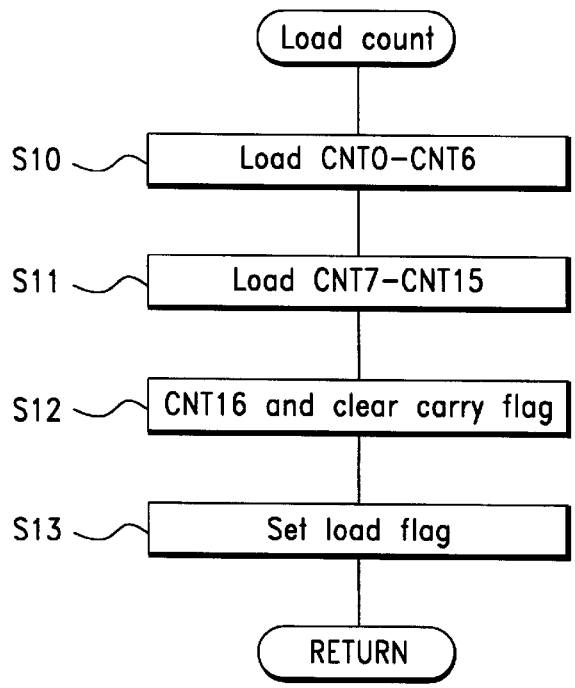
FIG. 6 is a flowchart showing the load count process in step S1 of FIG. 5 in detail.
Figure 7:
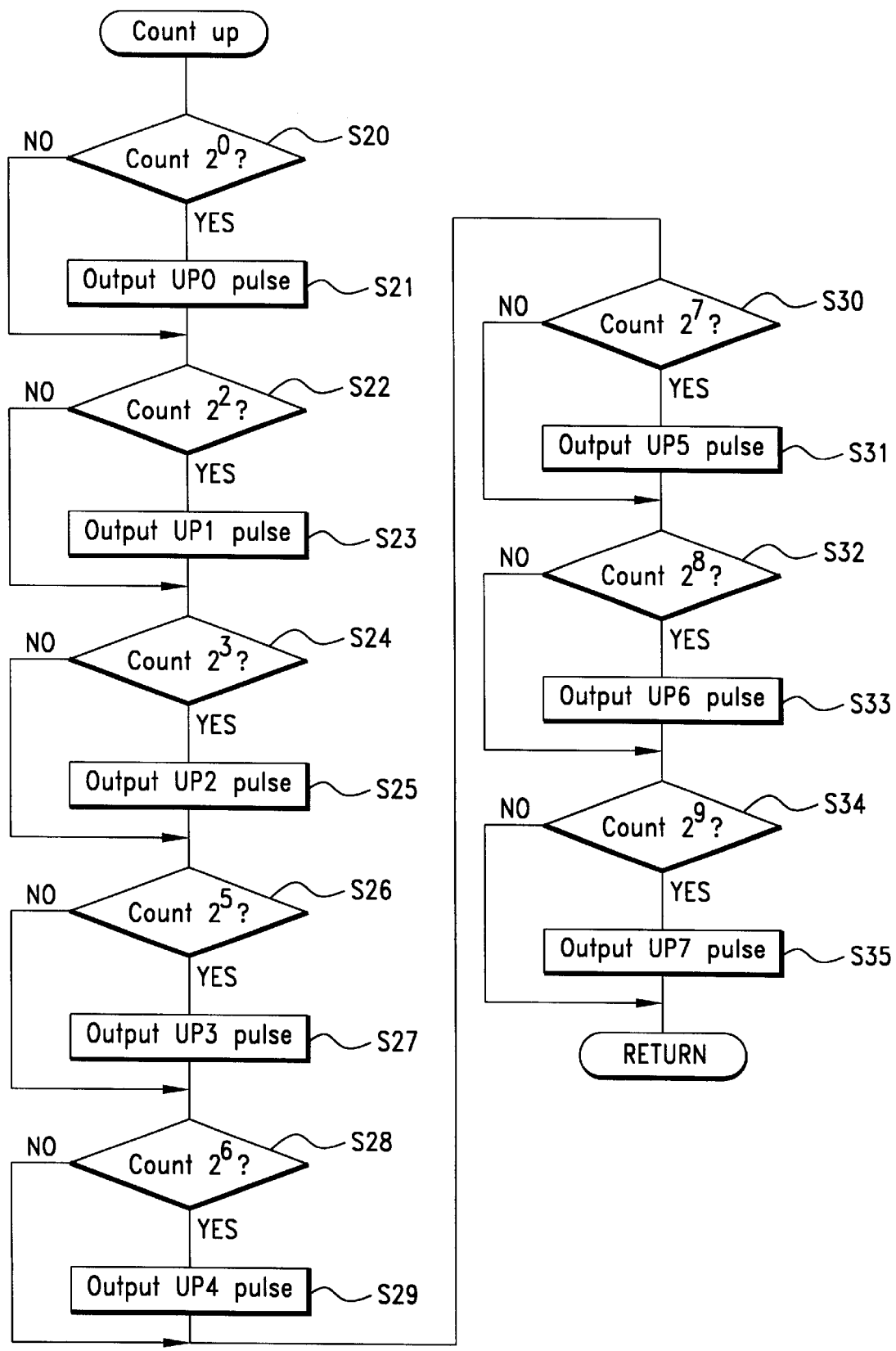
FIG. 7 is a flowchart showing the count up process in step S2 of FIG. 5 in detail.
Figure 8:
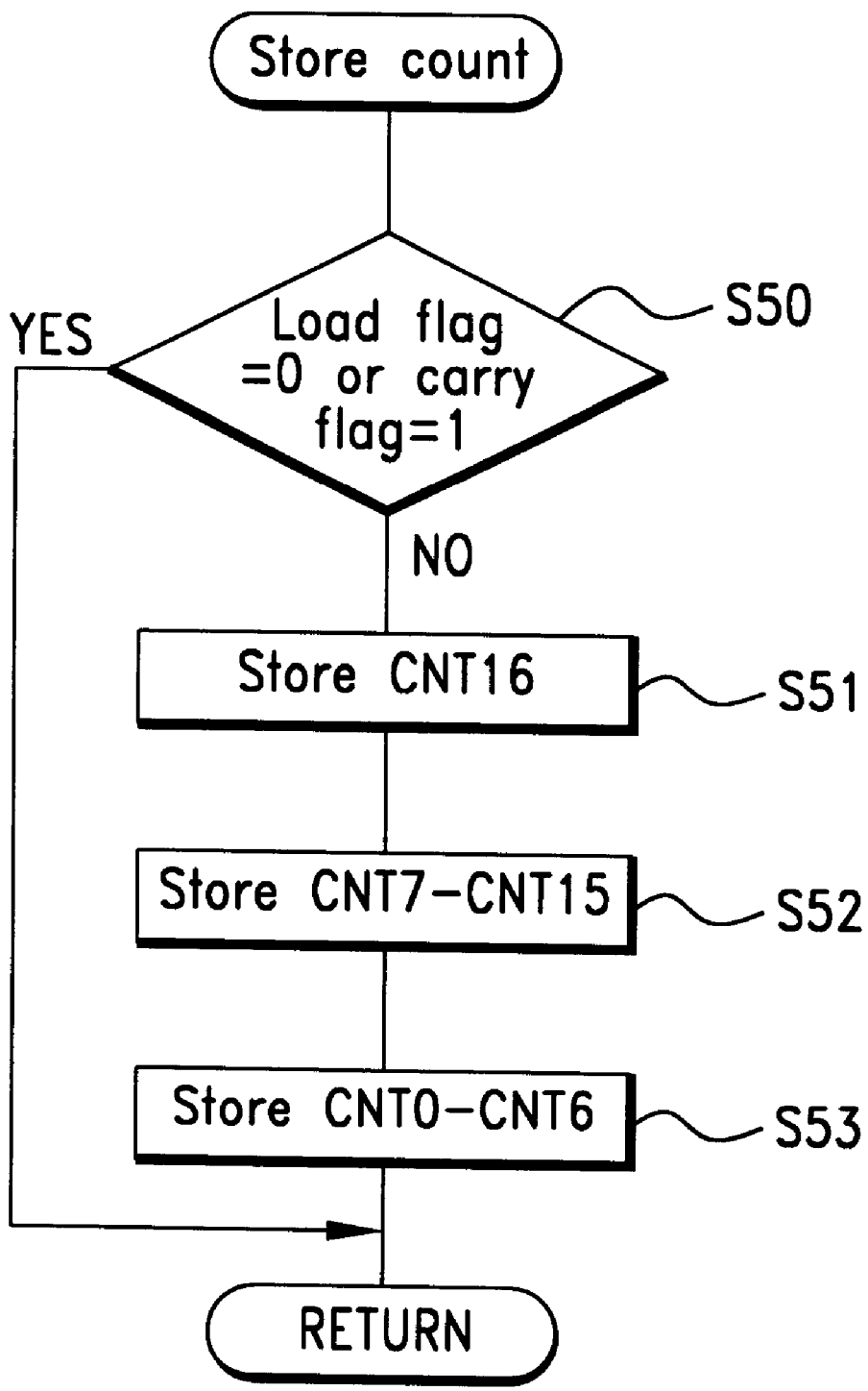
FIG. 8 is a flow chart showing the store count process in step S4 of FIG. 5 in detail.

Next, the frequency count processing of the first embodiment of the present invention will be described. FIG. 5 is a flowchart showing the frequency count processing of the first embodiment of the present invention. FIG. 6 is a flowchart showing a load count process of step S2 in FIG. 5 in detail. FIG. 7 is a flowchart showing a count up process in step S2 of FIG. 5 in detail. FIG. 8 is a flowchart showing a store count process of step S4 in FIG. 5 in detail.

In the description that follows, the frequency counter 1 is implemented in an IC card not shown in FIG. 1. Also, each of the processes of step S1, S2 and S4 in FIG. 5 are called IC card command processes, while all of the frequency count processes of FIG. 5 are for control of higher order devices not shown in the drawings. That is, the IC card carries out the three command processes, namely load count processing, count up processing and store count processing, according to commands from higher order devices. Nevertheless, it is possible for the IC card itself to control all of the frequency count process of FIG. 5.

First of all, the flow of the overall frequency count process of FIG. 5 will be described. In step S1, if a higher order device supplies a load count command to the IC card, the IC card supplies control signals to the EEPROM counter section 12 for outputting frequency data. The IC card also supplies a load count signal LD to the binary counter section 11, and supplies a control signal for setting a flag to the load flag 13. The EEPROM counter section 12 outputs (n+1) bit frequency data Na stored in the EEPROM 40 to the data bus L1. The binary counter section 11 loads the frequency data Na from the data bus L1 into the binary counter 20, clears the carry flag section 21 to "0" and sets the load flag 13 to "1" (load count processing). In FIG. 2, the carry flag output F2 of "0" corresponds to an L level, and a "1" corresponds to an H level.

The loaded frequency data Na before being updated uses coefficients $a_0, a_1, \ldots a_n$, of 0 or 1, and can be represented by the following equation.

$$Na = a_0 \times 2^0 + a_1 \times 2^1 \ldots + a_n \times 2^n. \quad (1)$$

Next, in step S2, when the higher order device supplies a count up command, for counting up the frequency Nc1, to the IC card, the IC card supplies a count up pulse UP to the binary counter section 11 and the binary counter section 11 counts up the frequency Nc1 (count up processing). In this count up processing, counting up uses at least one specified count step value among the count step values $2^0, 2^1, \ldots 2^n$, and is carried out for one step value at a time. In the case where the binary counter 20 of the binary counter section 11 overflows, the carry flag F2 is set to "1" by the carry flag section 21.

Count frequency Nc1 uses coefficients $c_0, c_0, \ldots c_n$, of 0 or 1, and can be represented by the following equation.

$$Nc1 = c_0 \times 2^0 + c_1 \times 2^1 \ldots + c_n \times 2^n. \quad (2)$$

If the higher order device supplies the frequency Nd to be newly added to the frequency data Na before update, coefficients $d_0, d_1, \ldots d^n$ being 0 or positive integers are used, addition frequency Nd is expanded as follows, $$Nc1 = d_0 \times 2^0 + d_1 \times 2^1 \ldots + d_n \times 2^n. \quad (3)$$

and based on coefficient $d_1$ of addition frequency Nd the coefficient $c_i$ of count frequency Nc1 is determined, with a count up of a count step value $2_i$ being executed once if $c_i=1$. When $d_i=0$, $c_i=0$, and when $d_i \geq 1$, $c_i=1$. Accordingly, Nc1= Nd. On the other hand, frequency data to be newly written into the EEPROM 40 (updated frequency data) is Na+Nd. When the binary counter section 11 has the structure of FIG. 2, $c_0, c_4, c_{10}-c_n$, and $d_0, d_4, d_{10}-d_n$ are always 0.

Next, in step S3, the higher order device recognizes whether count frequency data Nc1 for the count up processing of step S2 is equal to addition frequency Nd, or smaller than Nd. If Nc1<Nd, processing returns to step S2, the higher order device supplies a count up command, for causing the count frequency Nc2 to be counted up, to the binary counter section 11 and counting up of frequency Nc2 is executed.

Count frequency Nc2 uses coefficients $e_0, e_1, \ldots e_n$, of 0 or 1, and can be represented by the following equation.

$$Nc2 = e_0 \times 2^0 + e_1 \times 2^1 \ldots + e_n \times 2^n. \quad (4)$$

The IC card develops the already counted up frequency Nc1 deducted from addition frequency Nd, Nd−Nc1, using coefficients $f_0, f_1, \ldots f_n$ being 0 or positive integers as follows, $$Nd - Nc1 = f_0 \times 2^0 + f_1 \times 2^1 \ldots + f_n \times 2^n. \quad (5)$$

The coefficient $e_i$ of count frequency Nc2 is determined based on coefficient $f_1$, similarly to the initial count up processing, and if $e_i=1$, a count up of a count step value $2^i$ is executed.

In this way, step S2 and step S3 are repeated until the count frequency sum Nc (=Nc1+Nc2+...) is equal to the addition frequency Nd, and when Nc becomes equal to Nd, processing continues to step S4.

It is also possible that in step S2, the count up of count step value $2^i$ is not executed once, but the same number of times as the value of coefficient $d_i$ of equation (3), without repeating steps S2 and S3. In this case, the count frequency Nc1 is equal to the addition frequency Nd, so $$Nc1 = d_0 \times 2^0 + d_1 \times 2^1 \ldots + d_n \times 2^n. \quad (2)$$

Next, in step S4, when the higher order device supplies a store count command to the IC card, the IC card examines the states of the load flag output F1 of the load flag 13 and the carry flag output F2 of the carry flag section 21. If the load flag output F1 is "1" and the carry flag output F2 is "0", the IC card supplies a store count signal RD to the binary counter section 11, and supplies a control signal for writing frequency data to the EEPROM counter section 12. The binary counter section 11 outputs updated frequency data Na+Nd generated in the count up processing to the data bus L1. The EEPROM counter section 12 writes the above-mentioned updated data Na+Nd into the EEPROM 40 (store-count processing). Also, if the load flag output F1 is "0", or the carry flag output F2 is one, the IC card completes the processing of FIG. 5 without executing this store count processing.

Next, the load count processing in step S1 of FIG. 5 will be described in detail using FIG. 1, FIG. 2 and FIG. 6. First of all, in step S10, the EEPROM counter section 12 outputs the lower 8 bits $a_0-a_7$ within the 17 bits of current frequency data Na=[$a_{16},a_{15} \ldots a_0$] ([] represents binary notation), stored in the EEPROM 40, to the data bus L1 in response to a control signal from the IC card. The binary counter section 11 loads the above-described bits $a_0-a_7$ from the data bus L1 into the bit counters CNT0–CNT7 when the higher order device causes the load count signal LD0 to change from an L level to an H level. Before executing the load of current frequency data Na=[$a_{16},a_{15} \ldots a_0$], the load flag 13 is set to "0" in response to a control signal from the IC card.

Next, in step S11, the EEPROM counter section 12 outputs the next 8 bits $a_8-a_{15}$ of the current frequency data Na=[$a_{16},a_{15} \ldots a_0$] onto the data bus L1. The binary counter section 11 then loads bits $a_8-a_{15}$ into the bit counters CNT8–CNT15 when the higher order device causes the load count signal LD1 to change to an H level.

Next, in step S12, the EEPROM counter section 12 outputs the most significant bit $a_{16}$ of the current frequency data Na=[$a_{16},a_{15} \ldots a_0$] onto the data bus L1. The binary counter section 11 then loads bit a16 into the bit counter CNT16 when the higher order device causes the load count signal LD2 to change to an H level, and resets the carry flag section 21 to a logic level "0" (L level).

Finally, in step S13, the load flag 13 is set to "1" in response to a control signal from the IC card. This load flag 13 is only used by the higher order device to determine whether or not load count processing has been completed at the time of store count processing. With that, the load count processing is completed.

Next, the count up processing of step S2 in FIG. 5 will be described in detail using FIG. 1 to FIG. 3 and FIG. 7. If the higher order device supplies the addition frequency Nd, this can be expanded as follows in accordance with equation (3).

$$Nd = d_0 \times 2^0 + d_2 \times 2^2 + d_3 \times 2^3 + d_5 \times 2^5 + d_6 \times 2^6 + d_7 \times 2^7 + d_8 \times 2^8 + d_9 \times 2^9 \quad (6)$$

The coefficients $c_0$, $c_2$, $c_3$, $c_5$–$c_9$ of count frequency Nc1 shown in equation (2) can be determined based on the coefficients $d_0$, $d_2$, $d_3$, $d_5$–$d_9$ of equation (6). A count up command for counting up frequency Nc1 is then supplied to the IC card, and the IC card executes the count up processing of FIG. 7. First of all, in step S20, a decision as to whether or not to execute count up for a count up value of $2^0$ is made based on the value of coefficient $c_0$ of count frequency Nc1. If $c_0=0$, a count up of $2^0$ is not executed, and processing advances to step S22. If $c_0=1$, one count up pulse UP0 is output in step 521. This count up pulse UP0 is supplied to the U terminal of bit counter CNT0, and the binary counter section 11 executes a count up of $2^0$ once.

Next, in steps S22–S23, similarly to steps S20–S21, processing is executed for a count up of a count value of $2^2$. Specifically, in step S22, if coefficient $c_2$ of count frequency Nc1=0, a count up of $2^2$ is not executed and processing advances to step S24. If $c_2=1$, one count up pulse UP1 is output in step S23. This pulse UP1 is supplied to the U terminal of bit counter CNT2 through an OR gate 22, and the binary counter section 11 executes a count up of $2^2$ once.

In a similar fashion, processing for counting up by a count step value of $2^3$ is carried out in steps S24–S25, processing for counting up by a count step value of $2^5$ is carried out in steps S26–S27, processing for counting up by a count step value of $2^6$ is carried out in steps S28–S29, processing for counting up by a count step value of $2^7$ is carried out in steps S30–S31, processing for counting up by a count step value of $2^8$ is carried out in steps S32–S33, and processing for counting up by a count step value of $2^9$ is carried out in steps S34–S35. This completes the count up processing of FIG. 7.

In the above described count up processing, if a carry is generated at bit counter CNT16 and a carry pulse is output, the carry flag section 21 is set to "1" (H level). The carry flag output F2 is cleared to "0" (L level) before the count up processing by the load signal LD2.

It is possible that a count up by a count step value of $2i$ is not carried out once, but is carried out the same number of times as a value of coefficient $d_i$ of equation (3). In this case, in steps S21, S23, S25, S29, S31, S33 and S35, a number of count up pulses UP the same as the value of coefficient $d_i$ of the addition frequency Nd can be input to bit counter CNT1.

Figure 9:
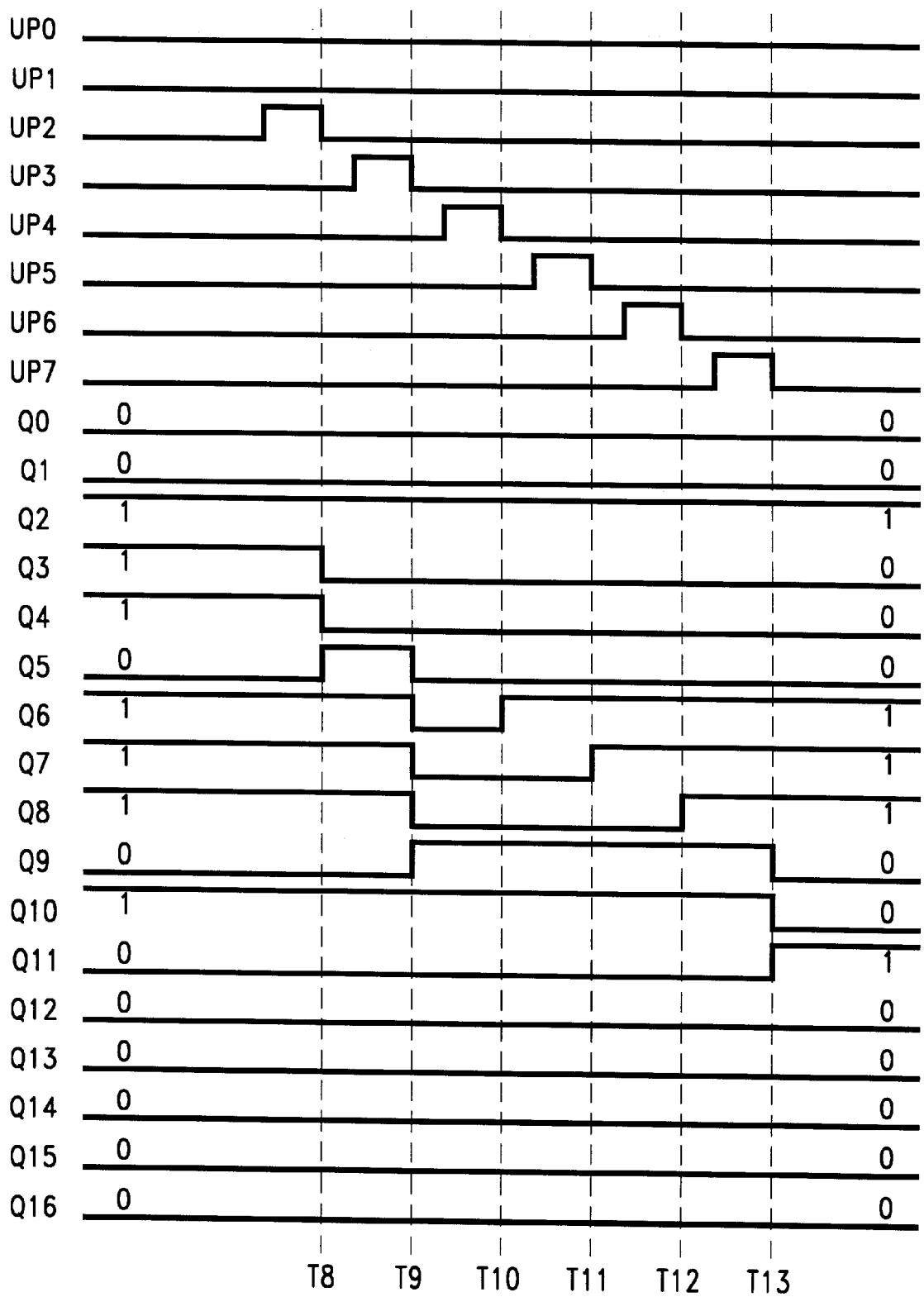
FIG. 9 is a timing diagram showing the count up process of the first embodiment.

FIG. 9 is a timing chart showing one example of the count up processing of the binary counter section 11 having the structure of FIG. 2. In FIG. 9, waveforms are shown for count up pulses UP0–UP7, and count bits Q0–Q16. In FIG. 9, current frequency data Na loaded from the EEPROM 40 is 1500=[0 0000 0101 1101 1100]. Within the [ ] symbols, the extreme left value is equivalent to count bit Q16, and the extreme right value is equivalent to count bit Q0. Accordingly, at the stage after load count has been completed, the count bits Q0, Q1, Q5, Q9, and Q11–Q16 of the binary counter 20 are at an L level, while count bits Q2–Q4, Q6–Q8 and Q10 are at an H level. The count frequency Nd is 1000. This can be expanded as follows.

$$Nd = 1000 \quad (7)$$
$$= 0 \times 2^0 + 0 \times 2^2 + 1 \times 2^3 + 1 \times 2^5 + 1 \times 2^6 + 1 \times 2^7 + 1 \times 2^8 + 1 \times 2^9$$

The coefficients of the count frequency Nd are all 0 or 1, which means that the count frequency Nc1 is equal to the addition frequency Nd, giving $$Nc1 = 1 \times 2^3 + 1 \times 2^5 + 1 \times 2^6 + 1 \times 2^7 + 1 \times 2^8 + 1 \times 2^9 \quad (8)$$

Accordingly, if count up processing shown in step S2 of FIG. 5 is carried out once, the addition frequency Nd can be counted up, and count up can be executed separately for each of count step values of $2^3$, $2^5$, $2^6$, $2^7$, $2^8$, and $2^9$. Specifically, the count up pulses UP2, UP3, UP4, UP5, UP6 and UP7 have their timing shifted one at a time, and are then input to the binary counter 20. Here, carry output cy of bit counter CNTi will be described as CYi.

First of all, the count up pulse UP2 is input to the U terminal of bit counter CNT3 through an OR gate 23, count bit Q3 of bit counter CNT3 is inverted from H to L on the falling edge at time T8, and carry pulse CY3 is output. The count bit Q4 of the bit counter CNT4 is inverted from H to L by this pulse CY3, and carry pulse CY4 is output. The count bit Q5 of the bit counter CNT5 is inverted from L to H by this pulse CY4. That is, as a result of the count up pulse UP2, a count up by a count step value of $2^3$ is executed once, which is a count up by a frequency of $2^3=8$.

Next, the count up pulse UP3 is input to the U terminal of bit counter CNT5 through an OR gate 24, and count bit Q5 of bit counter CNT5 is inverted from H to L on the falling edge at time T9. Count bits Q6–Q8 of bit counters CNT6–CNT6 are respectively inverted from H to L by carry pulses CY5–CY7. The count bit Q9 of the bit counter CNT9 is inverted from L to H by carry pulse CY8. That is, as a result of the count up pulse UP3, a count up by a count step value of $2^5$ is executed once, which is a count up by a frequency of $2^5=32$.

Next, the count up pulse UP4 is input to bit counter CNT6 through an OR gate 25, and count bit Q6 of bit counter CNT6 is inverted from L to H on the falling edge at time T10. That is, as a result of the count up pulse UP4, a count up by a count step value of $2^6$ is executed once, which is a count up by a frequency of $2^6=64$.

Next, the count up pulse UP5 is input to bit counter CNT7 through an OR gate 26, and count bit Q7 of bit counter CNT7 is inverted from L to H on the falling edge at time T11. That is, as a result of the count up pulse UP5, a count up by a count step value of $2^7$ is executed once, which is a count up by a frequency of $2^7=128$.

Next, the count up pulse UP6 is input to bit counter CNT8 through an OR gate 27, and count bit Q8 of bit counter CNT8 is inverted from L to H on the falling edge at time T12. That is, as a result of the count up pulse UP6, a count up by a count step value of $2^8$ is executed once, which is a count up by a frequency of $2^8=256$.

Next, the count up pulse UP7 is input to bit counter CNT9 through an OR gate 28, and count bit Q9 of bit counter CNT9 is inverted from H to L on the falling edge at time T13. The count bit Q10 of bit counter CNT10 is inverted from H to L by the carry pulse CY9. The count bit Q11 of bit counter CNT11 is inverted from L to H by the carry pulse CY10. That is, as a result of the count up pulse UP7, a count up by a count step value of $2^9$ is executed once, which is a count up by a frequency of $2^9$=512. In this way, in the binary counter section 11 the current frequency data Na=1500, that has been loaded from the EEPROM 40 is counted up only by the addition frequency Nd=1000, and updated frequency data Na+Nd=2500=[0 0000 1001 1100 0100] is generated.

Next, the store count processing of step S4 in FIG. 5 will be described in detail using FIG. 1–FIG. 3 and FIG. 8. In step S50, the IC card examines the states of the load flag output F1 of the load flag 13 and the carry flag output F2 of the carry flag section 21. If the load flag output F1 is "0" and the carry flag output F2 is "1", the IC card does not carry out the processing of steps S51–S53 in the frequency counter 1, and processing of FIG. 8 is completed. Specifically, the IC card does not set the store count signal RD to an H level, and as a result the frequency counter 1 does not write the frequency data of the binary counter section 11 into the EEPROM counter section 12. In this way, if load count processing is not carried out, the frequency data of the EEPROM counter section 12 are not updated when the binary counter section 11 has been made to overflow by counting up.

Further, if the load flag output F1 is "1" and the carry flag output F2 is "0", the IC card executes the processing of steps S52 to S53, and the frequency counter 1 writes updated frequency data Na+Nd that has been generated by the binary counter section 11 into the EEPROM counter section 12

First of all, in step S51, the IC card causes the store count signal RD2 to change to "H ". The bit counter CNT16 outputs the count bit Q16 to the bus line b0 of data bus L1 through tristate gate 37. The EEPROM counter section 12 writes count bit Q16 constituting the most significant bit of the update frequency data Na+Nd to the upper byte memory cell s16 among the previously mentioned cells s0–s16 of the EEPROM 40.

Next, in step S52, the IC card causes the store count signal RD1 to change to "H". The bit counters CNT8–CNT15 respectively output the count bits Q8–Q15 to the bus lines b0–b7 of data bus L1 through tristate gates 37. The EEPROM counter section 12 writes count bits Q8–Q15 constituting the middle eight bits of the update frequency data Na+Nd to the middle byte memory cells s8–s15 of the EEPROM 40.

Finally, in step S53, the IC card causes the store count signal RD0 to change to "H". The bit counters CNT0–CNT7 respectively output the count bits Q0–Q7 to the bus lines b0–b7 of data bus L1 through tristate gates 37. The EEPROM counter section 12 writes count bits Q0–Q7 constituting the lower eight bits of the update frequency data Na+Nd to the lower byte memory cells s0–s7 of the EEPROM 40,in response to a control signal from the IC card. In the above described manner, the 17 bit frequency data of the EEPROM 40 are rewritten from data before update Na to updated frequency data Na+Nd.

The EEPROM 40 rewrites data for each byte, as has been described above. For this purpose, all memory cells within the byte are erased, and specified memory cells are put into a rewritten state. When memory cells of the EEPROM 40 are in the erased state it corresponds to a bit value of 1, and when the memory cells are in the rewritten state it corresponds to a bit value of 0. Accordingly, for example, the procedure of rewriting the lower byte data is to initially rewrite all memory cells s0–s7 to 1, then rewrite memory cells corresponding to count bits that have a bit value of 0 to 0. The procedure of rewriting the upper byte data is to initially rewrite the memory cell s16 to 1, then rewrite the memory cell s16 to 0 if count bit Q15 is 0. If the byte including the most significant bit of frequency data (the upper byte in this case) is initially rewritten, as in the store count processing of FIG. 8, the frequency data of the EEPROM 40 does not become smaller than the current frequency data Na, even momentarily, during the store count processing. Accordingly, even if the power to the frequency counter 1 is disconnected during the store count processing, due to removal of the IC card, etc., the frequency data will not be updated retrogressively, that is, to a smaller value than the current frequency data Na.

Thus, according to the first embodiment, because the binary counter section 11 and the EEPROM counter section 12 are provided in the frequency counter 1, frequency data that is stored in the EEPROM 40 of the EEPROM counter section 12 is loaded into the binary counter 20 of the binary counter section 11. After that, the binary counter 20 performs a count up by a specified frequency and writes the counted up frequency data into the EEPROM 40. Rewriting of the EEPROM 40 is carried out once in one frequency count process. This means that even if the number of rewrites of the EEPROM 40 is restricted to 10,000 times it can handle a frequency count of 10,000. Also, binary data is rewritten to the EEPROM 40 which means that the number of memory cells can be reduced compared to a frequency counter of the related art. This means that the EEPROM 40 can be made small.

Further, the load flag 13 indicating whether or not a load count has been carried out, and the carry flag 21 indicating whether or not the binary counter 20 overflows, are provided in the frequency counter 1. This means that the frequency data of the EEPROM 40 is not updated when the count load processing has not been executed, and when the binary counter 20 does not overflow. The frequency data is not retrogressively updated (made smaller). Accordingly, it is possible to prevent illegal use of an IC card containing the frequency counter 1.

Also, the erased state of the EEPROM 40 corresponds to a frequency data bit value of 1, and at the time of store count processing the upper byte of the EEPROM 40 where the most significant bit of the frequency data is to be written, is updated first. This means that even if the power supply to the IC card is interrupted during store count processing due to the card being removed, etc., EEPROM 40 frequency data will not revert to old data. Accordingly, it is possible to prevent illegal use of an IC card containing the frequency counter 1.

With the structure where a count up pulse can be input to any arbitrary bit counter CNTi of the binary counter 20 through an OR gate, it is possible to count up by a count step value of $2^i$. The frequency count processing time can be made shorter than in the case of counting up one at a time, as in the related art.

Second Embodiment

Figure 10:
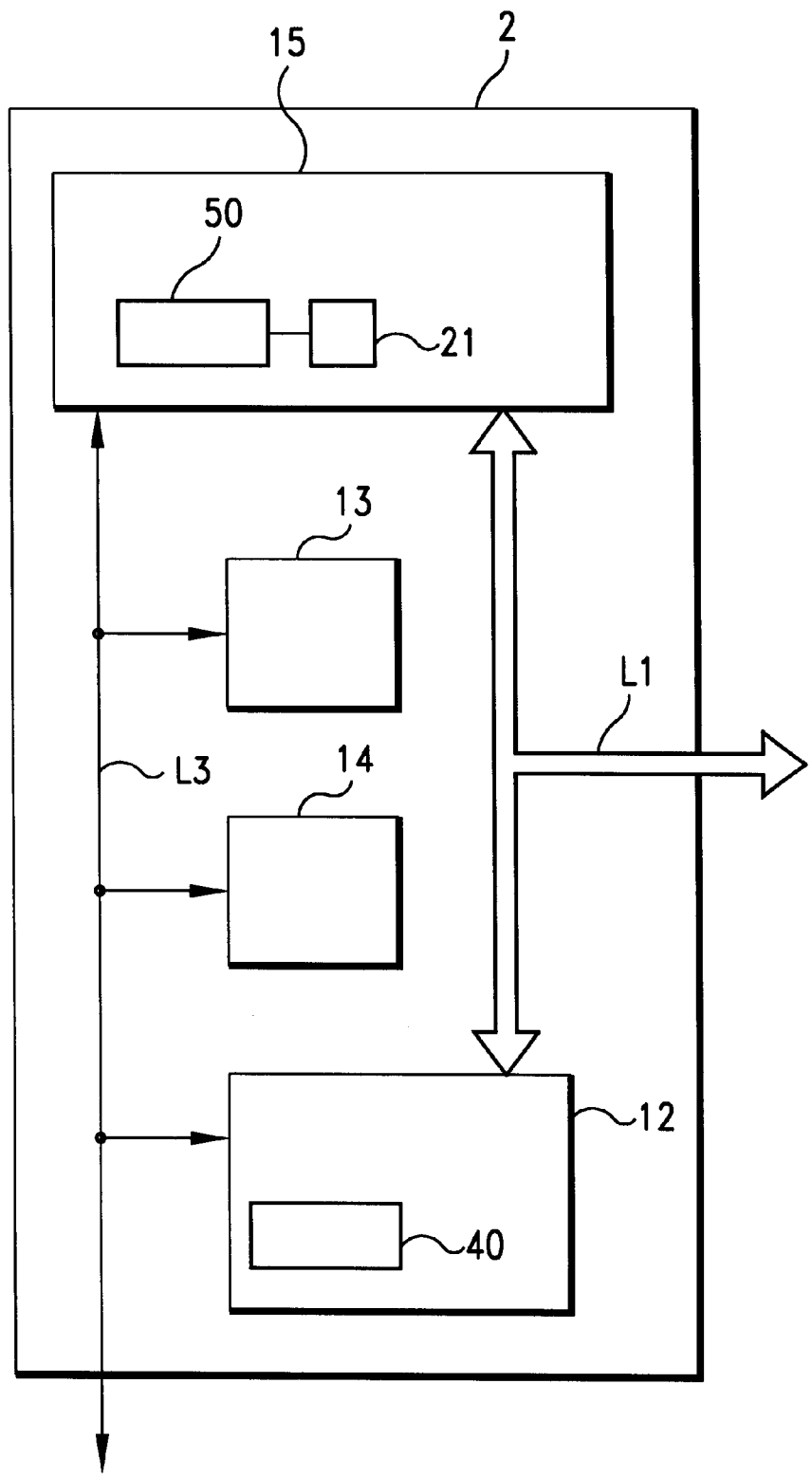
FIG. 10 is a block diagram showing a frequency counter of a second embodiment of the present invention.

FIG. 10 is a structural block diagram showing the configuration of a frequency counter 2 of the second embodiment of the present invention, and parts that are the same as FIG. 1 have the same reference numerals attached thereto. The frequency counter 2 has a recharge flag 14 provided in the frequency counter of FIG. 1, and the binary counter section 11 is constructed as the binary counter section 15. That is, the frequency counter 2 comprises the binary counter section 15, the EEPROM counter section 12, the load flag 13 and the recharge flag 14, the data bus L1 and a control line section L3. The binary counter section 15, compared to the binary counter section 11 in FIG. 1, is configured having a binary counter 50 instead of the binary counter 20. That is, the binary counter section 15 comprises the carry flag section 21 and the binary counter 50. The recharge flag 14 has the same structure as the load flag 13, for example, and the output from the recharge flag 14 is called the recharge flag output F3. The control line section L3 differs from the control line section L2 in FIG. 1 in that it is provided with a control line for controlling the recharge flag 14 and an output signal line of the recharge flag 14.

Figure 11:
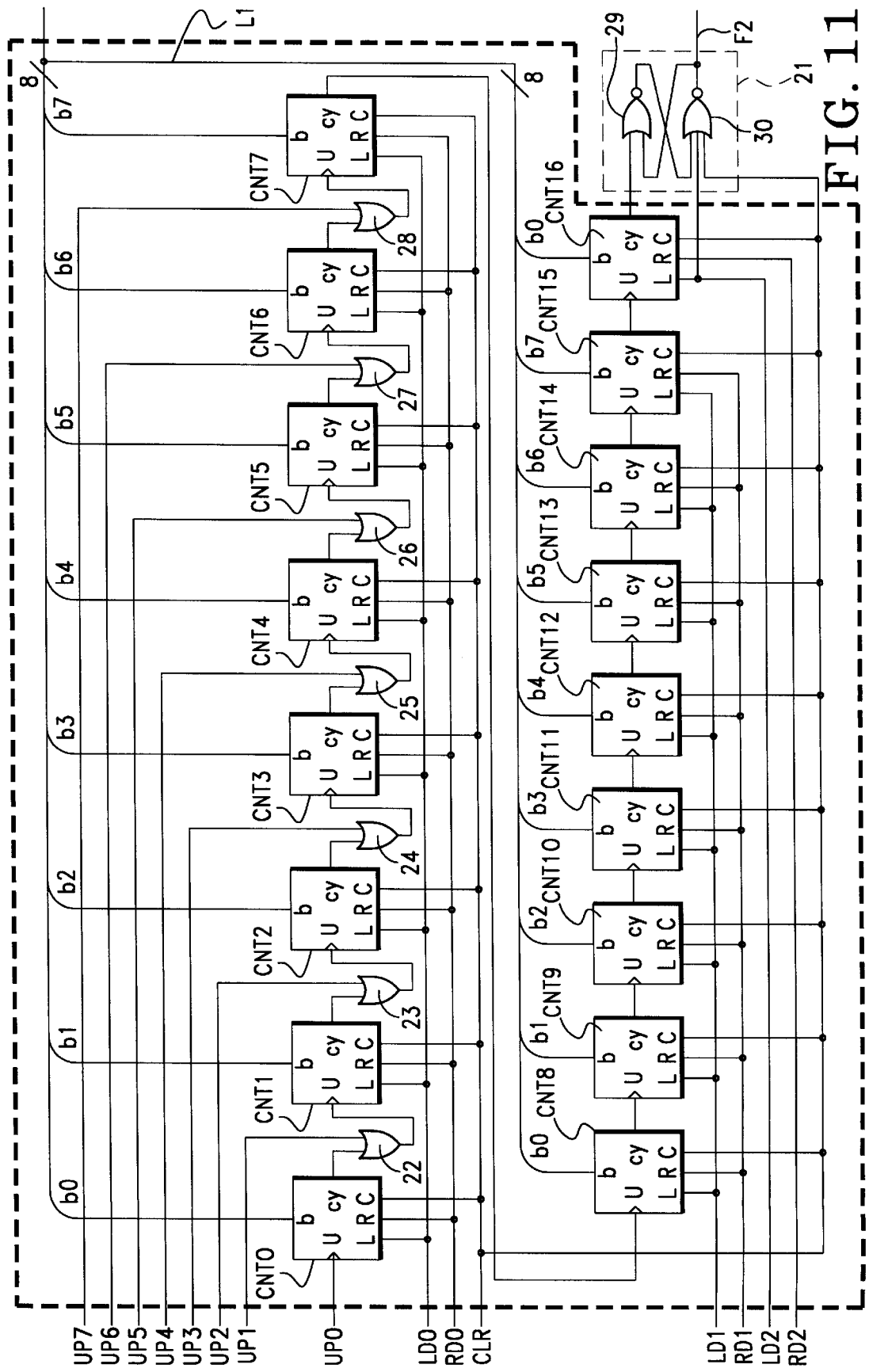
FIG. 11 is a circuit diagram, of a binary counter section of the frequency counter of the second embodiment.

FIG. 11 is a circuit diagram of the binary counter section 15, and parts that are the same as parts in FIG. 2 have the same reference numerals attached thereto. The binary counter 50 and the binary counter 20 of FIG. 2 differ in the bit positions where out-cuts of the OR gates has the 22–28 are input, but the remaining structure is the same. The binary counter 50 respective OR gates 22–28 provided in the cascade connection section of bit counters CNT0–CNT7, and count up pulses UP0–UP7 are respectively input to the U terminals (refer to FIG. 3) of bit counters CNT0–CNT7.

The operation of the binary counter 50 is almost the same as the operation of the binary counter 20 in FIG. 2, but because the positions of the OR gates 22–28 are different, the number that can be counted up at one time (count up value) is slightly different. In the binary counter 50, it is possible to count up by different values, according to the count up pulse UP applied. Namely, a count up value of $2^0$ (=1) is possible with count up pulse UP0, a count up value of $2^1$ (=2) is possible with count up pulse UP2, a count up value of $2^2$ (=4) is possible with count up pulse UP2, a count up value of $2^3$ (=8) is possible with count up pulse UP3, a count up value of $2^4$ (=16) is possible with count up pulse UP4, a count up value of $2^5$ (=32) is possible with count up pulse UP5, a count up value of $2^6$ (=64) is possible with count up pulse UP6, and a count up value of $2^7$ (=128) is possible with count up pulse UP7. Namely, all numbers from $2^0$–$2^7$ can be counted up at one time. Accordingly, by selectively controlling the count up pulses UP0–UP7, it is possible to freely count up a frequency of from 1–255 in one count up process shown in step S2 of FIG. 5. In this case, it represents the equivalent operation to that of an 8 bit adder.

In the second embodiment of the present invention, apart from the frequency count processing, recharge processing is added, and the frequency data stored in the EEPROM counter section 12 of the frequency counter 2 can be updated to an arbitrary value. In this way, for example, it is possible to reuse an IC card in which the frequency counter 2 is packaged. However, the frequency count process of the second embodiment is carried out using the processing flow shown in FIG. 5 of the above described first embodiment.

The recharge processing of the second embodiment of the present invention will now be described below. FIG. 12 is a flowchart showing the recharge process of the second embodiment of the present invention. In the following description, similarly to the first embodiment, the frequency counter 2 is packaged in an IC card. Also as in the first embodiment, the recharge processing of FIG. 12 and the count up processing are controlled by a higher order device. The recharge processing of FIG. 12 is command processing of the IC card. However, the IC card itself can also control the recharge processing of FIG. 12 and the count up processing.

The recharge flag 14 is a circuit granting allowance/nonallowance of recharge command execution. Here, a logic level "0" indicates that execution is not allowed, while a logic level "1" indicates that execution is allowed. The recharge flag 14 is cleared to "0" at the time of activation of the IC card (when used for shopping, when frequency data is stored, and when frequency count processing is possible).

In order to carry out the recharge processing, for security reasons there is a need for processing to allow execution of password comparison and verification processing etc. If this processing executes correctly, the recharge flag 14 is set to "1". This is to prevent the frequency counter being illegally recharged.

If a recharge command is output from the higher order device, the IC card executes the recharge processing of FIG. 12. First of all, in step S60, the IC card examines whether or not the recharge flag output F3 of recharge flag 14 is "1". If the recharge flag output F3 is "0", the IC card decides that execution of recharge is not permitted, and the processing of FIG. 12 is completed. If the recharge flag output F3 is "1", the IC card executes the processing of steps S61–S62.

In step S61, the IC card outputs a clear signal CLR to the frequency counter 2, and the count bits Q0–Q16 of the bit counters CNT0–CNT16 of the binary counter section 15, as well as the carry flag section 21, are cleared to "0" (L).

In step S62, the IC card supplies a control signal for setting a flag to the load flag 13, and the load flag 13 is set to "1". As a result of the processing of step S61 and step S62 the count value of the binary counter 50 reverts to the initial value (=0). Also, the load flag output F1 is set to "1", indicating that store count processing is permitted, and recharge processing is completed.

Next, if store count processing is executed initial value frequency data is written to the EEPROM counter section 12 and the frequency counter 2 is recharged. However, if count up processing is carried out before the store count processing, it is possible to recharge the frequency counter 2 to any arbitrary value. It is also possible to carry out processing up to store count processing within the recharge command processing. However, if recharging to an arbitrary value is considered, the number of times of rewriting to the EEPROM can be reduced which means that it is better to carry out store count processing separately.

According to the second embodiment, by providing the recharge flag 14 indicating whether recharge processing for the frequency counter 2 is allowable/not allowable, recharging is allowable upon completing password comparison processing, etc. After that, when the recharge flag 14 has been set, recharge processing can be carried out to write initial data (=0), or any arbitrary frequency data, into the EEPROM 40. It is therefore possible to reuse the IC card.

The counter is configured so that count up pulses UP0–UP7 can be input to the U terminals of bit counters CNT0–CNT7 of the binary counter 20. This means that a count up by an arbitrary count step value from 1–256 is possible. Also, the same function as that of an 8-bit adder can be realized simply in a counter, which means that the frequency count processing time can be shortened.

In the first and second embodiments described above, frequency is counted by counting up, but it goes without saying that frequency can also be counted by counting down.

Further, the number and position of OR gate binary counters for performing a count of a count step value of $2^i$ is not restricted to the manner shown in FIG. 2 and FIG. 11, but they can be set arbitrarily. Also, the polarity of the load flag 13, the carry flag section 21 and the recharge flag 14 is not limited to those shown in the first and second embodiments described above.

In the above-described first and second embodiments, rewriting of frequency data of the EEPROM 40 is byte write mode, where data is rewritten in byte units, but it is also possible to rewrite all bits simultaneously. In page write mode, in cases where the IC card is removed, etc., in an erased state, all bits values have been set to "1", which means that the IC card was used. This is effective in preventing the frequency data from being retrogressively updated.

In the above-described first and second embodiments, a plurality of digits are counted up in a single count up command process, but it is also possible to count up only a single digit in one command process.

What is claimed is:

1. A count circuit, comprising:
   a rewritable non-volatile memory for storing count data composed of a plurality of bits; and
   a counter, separate from said non-volatile memory, storing the count data read out from said non-volatile memory, the counter being, responsive to update information representing individual changes to ones of the plurality of bits of the count data to update the stored count data, and outputting the updated data as count data to said non-volatile memory.

2. The count circuit claimed in claim 1, further comprising an indication circuit indicating a read-out state of the count data.

3. The count circuit claimed in claim 2, wherein the indication circuit indicating an overflow state is a first indication circuit, further comprising a second indication circuit indicating an overflow state of said counter.

4. The count circuit claimed in claim 3, further comprising a third indication circuit indicating allowability of initializing data in said counter.

5. The count circuit claimed in claim 1, further comprising an indication circuit indicating an overflow state of said counter.

6. A count circuit according to claim 1, wherein the rewriteable non-volatile memory stores count data composed of multiple bits of differing numerical significance; and wherein the counter is responsive to update information representing bit-by-bit changes in the count data for a plurality of the bits to update the stored count data.

7. The count circuit claimed in claim 6, wherein the count data and the updated data are (n+1) bit data (where n is a positive integer), and said counter executes counts in a count step value of $2^i$ (where i is an integer between zero and n).

8. The count circuit claimed in claim 7, wherein said counter has (n+20) flip flops, and executes counts of said count step values of $2^i$ in response to clock signals.

9. The counter circuit of claim 1, wherein said counter circuit is mounted in an IC card.

10. A counting method using a rewritable non-volatile memory, including:
    a first step of reading out count data composed of a plurality of bits stored in said non-volatile memory;
    a second step of storing in a counter the count data read out from said non-volatile memory;
    a third step of providing to the counter update information representing individual changes to ones of the plurality of bits of the count data, the counter responding to the update information to update the stored count data in said counter, including changing the individual ones of the plurality of bits of the stored count data based on the respective information representing the individual changes thereto; and
    a fourth step of writing the updated data as count data to said non-volatile memory.

11. The counting method claimed in claim 10, wherein writing of said third step is controlled by information indicating a read out state of said count data and information indicating an overflow state of said counter.

12. The counting method claimed in claim 11, wherein initialization of said counter is controlled based on information indicating allowability of initializing data in said counter.

13. The counting method claimed in claim 10, wherein updating in said second step is carried out in byte units.

14. The counting method claimed in claim 10, wherein the updating in said second step is carried out simultaneously for all bits of said counter data.

15. A counting method according to claim 10, wherein the first step includes reading out bits of differing numerical significance stored in the room in the non-volatile memory; and wherein the third step includes providing information representing bit-by-bit changes in the stored count data for multiple bits.

16. The counting method claimed in claim 15, wherein said count data is (n+1) bit data (where n is a positive integer), and said counter executes counts in count step values of $2^i$ (where i is an integer between 0 and n).

17. The counting method claimed in claim 16, wherein said counter executes counting a respective fixed number of times with at least one selected count step value.

18. The counting method claimed in claim 15, wherein updating in said second step is updating from a byte including the most significant bit of the count data.

19. A count circuit; comprising
    a rewritable non-volatile memory storing count data comprised of a plurality of bits of differing numerical significances;
    a reading circuit reading out, for storage outside of the memory, the count data stored in the memory;
    a counter, the counter being responsive to update information representing bit-by-bit changes in the count data for multiple bits to update the count data stored outside of the memory, the counter outputting the updated data from the counter as count data to the memory.

20. The count circuit claimed in claim 19, wherein the multiple bits include (n+1) bits ordered successively from 0 to n, wherein n is a positive integer, and the numerical significance of the ordered bits is $2^i$ where i is the order number.

* * * * *